(12) United States Patent
Dimitrov et al.

(10) Patent No.: US 8,487,390 B2
(45) Date of Patent: Jul. 16, 2013

(54) MEMORY CELL WITH STRESS-INDUCED ANISOTROPY

(75) Inventors: Dimitar V. Dimitrov, Edina, MN (US); Ivan Petrov Ivanov, Apple Valley, MN (US); Shuiyuan Huang, Apple Valley, MN (US); Antoine Khoueir, Apple Valley, MN (US); Brian Lee, Eden Prairie, MN (US); John Daniel Stricklin, Lakeville, MN (US); Olle Gunnar Heinonen, Eden Prairie, MN (US); Insik Jin, Eagan, MN (US)

(73) Assignee: Seagate Technology LLC, Cupertino, CA (US)

( * ) Notice: Subject to any disclaimer, the term of this patent is extended or adjusted under 35 U.S.C. 154(b) by 612 days.

(21) Appl. No.: 12/418,911

(22) Filed: Apr. 6, 2009

(65) Prior Publication Data
US 2010/0084724 A1    Apr. 8, 2010

Related U.S. Application Data

(60) Provisional application No. 61/103,752, filed on Oct. 8, 2008.

(51) Int. Cl.
 *H01L 29/82* (2006.01)
 *G11C 11/14* (2006.01)
(52) U.S. Cl.
 USPC ............ 257/421; 257/E21.665; 257/E29.323; 365/158; 365/171
(58) Field of Classification Search
 USPC ........... 257/421, E21.665, E29.323; 365/158, 365/171
 See application file for complete search history.

(56) References Cited

U.S. PATENT DOCUMENTS

| | | | |
|---|---|---|---|
| 5,461,526 | A | 10/1995 | Hamakawa |
| 5,841,692 | A | 11/1998 | Gallagher |
| 5,963,472 | A | 10/1999 | Inada |
| 6,166,948 | A | 12/2000 | Parkin |
| 6,183,859 | B1 | 2/2001 | Chen |
| 6,522,573 | B2 | 2/2003 | Saito |
| 6,597,618 | B2 | 7/2003 | Zheng |
| 6,605,772 | B2 | 8/2003 | Harman |
| 6,633,498 | B1 | 10/2003 | Engel |
| 6,714,444 | B2 | 3/2004 | Huai |
| 6,771,534 | B2 | 8/2004 | Stipe |
| 6,781,874 | B2 | 8/2004 | Hidaka |
| 6,791,865 | B2 | 9/2004 | Tran |
| 6,819,586 | B1 | 11/2004 | Anthony |

(Continued)

FOREIGN PATENT DOCUMENTS

WO    WO 2008/154519    12/2008

OTHER PUBLICATIONS

Berger, L., Emission of Spin waves by a magnetic multilayer traversed by a current, Physical Review B, Oct. 1, 1996, pp. 9353-9358, vol. 54, No. 13, The American Physical Society, USA.

(Continued)

*Primary Examiner* — Allison P Bernstein
(74) *Attorney, Agent, or Firm* — Mueting Raasch & Gebhardt PA

(57) ABSTRACT

A magnetic memory element that has a stress-induced magnetic anisotropy. The memory element has a ferromagnetic free layer having a switchable magnetization orientation switchable, a ferromagnetic reference layer having a pinned magnetization orientation, and a non-magnetic spacer layer therebetween. The free layer may be circular, essentially circular or nearly circular.

9 Claims, 6 Drawing Sheets

U.S. PATENT DOCUMENTS

| | | |
|---|---|---|
| 6,829,161 B2 | 12/2004 | Huai |
| 6,838,740 B2 | 1/2005 | Huai |
| 6,845,038 B1 | 1/2005 | Skukh |
| 6,847,547 B2 | 1/2005 | Albert |
| 6,888,742 B1 | 5/2005 | Nguyen |
| 6,903,400 B2 | 6/2005 | Kikuchi |
| 6,933,155 B2 | 8/2005 | Albert |
| 6,950,335 B2 | 9/2005 | Dieny |
| 6,958,927 B1 | 10/2005 | Nguyen |
| 6,963,098 B2 | 11/2005 | Daughton |
| 6,967,863 B2 | 11/2005 | Huai |
| 6,980,464 B2 | 12/2005 | Fukuzumi |
| 6,980,469 B2 | 12/2005 | Kent |
| 6,985,385 B2 | 1/2006 | Nguyen |
| 6,992,359 B2 | 1/2006 | Nguyen |
| 7,006,336 B2 | 2/2006 | Coffey |
| 7,020,009 B2 | 3/2006 | Ho |
| 7,031,178 B2 | 4/2006 | Parkin |
| 7,057,921 B2 | 6/2006 | Valet |
| 7,088,609 B2 | 8/2006 | Valet |
| 7,098,494 B2 | 8/2006 | Pakala |
| 7,110,287 B2 | 9/2006 | Huai |
| 7,126,202 B2 | 10/2006 | Huai |
| 7,160,770 B2 | 1/2007 | Susaki |
| 7,161,829 B2 | 1/2007 | Huai |
| 7,170,778 B2 | 1/2007 | Kent |
| 7,180,113 B2 | 2/2007 | Braun |
| 7,180,770 B2 | 2/2007 | Perner |
| 7,187,577 B1 | 3/2007 | Wang |
| 7,190,611 B2 | 3/2007 | Nguyen |
| 7,205,564 B2 | 4/2007 | Kajiyama |
| 7,224,601 B2 | 5/2007 | Panchula |
| 7,227,773 B1 | 6/2007 | Nguyen |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,242,045 B2 | 7/2007 | Nguyen |
| 7,242,048 B2 | 7/2007 | Huai |
| 7,245,462 B2 | 7/2007 | Huai |
| 7,252,852 B1 | 8/2007 | Parkin |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,286,395 B2 | 10/2007 | Chen |
| 7,289,356 B2 | 10/2007 | Diao |
| 7,307,876 B2 | 12/2007 | Kent |
| 7,310,265 B2 | 12/2007 | Zheng |
| 7,339,817 B2 | 3/2008 | Nickel |
| 7,342,169 B2 | 3/2008 | Venkatasubramanian |
| 7,345,911 B2 | 3/2008 | Min |
| 7,345,912 B2 | 3/2008 | Luo |
| 7,349,243 B2 | 3/2008 | Lin |
| 7,369,427 B2 | 5/2008 | Diao |
| 7,372,116 B2 | 5/2008 | Fullerton |
| 7,379,327 B2 | 5/2008 | Chen |
| 7,411,817 B2 | 8/2008 | Nozieres |
| 7,430,135 B2 | 9/2008 | Huai |
| 7,453,720 B2 | 11/2008 | Ju |
| 7,479,193 B1 | 1/2009 | Clark |
| 7,486,545 B2 | 2/2009 | Min |
| 7,486,551 B1 | 2/2009 | Li |
| 7,486,552 B2 | 2/2009 | Apalkov |
| 7,489,541 B2 | 2/2009 | Pakala |
| 7,502,249 B1 | 3/2009 | Ding |
| 7,508,702 B2 | 3/2009 | Ho |
| 7,515,457 B2 | 4/2009 | Chen |
| 7,518,835 B2 | 4/2009 | Huai |
| 7,525,862 B1 | 4/2009 | Sun |
| 7,576,956 B2 | 8/2009 | Huai |
| 7,660,151 B2 | 2/2010 | Leuscher |
| 7,800,095 B2 | 9/2010 | An |
| 7,804,709 B2 | 9/2010 | Wang |
| 2002/0181169 A1* | 12/2002 | Pinarbasi ................. 360/324.11 |
| 2002/0186582 A1 | 12/2002 | Sharma |
| 2004/0084702 A1 | 5/2004 | Jeong |
| 2004/0188733 A1* | 9/2004 | Asao et al. .................... 257/295 |
| 2004/0233760 A1* | 11/2004 | Guo et al. ..................... 365/222 |
| 2005/0018475 A1 | 1/2005 | Tran |
| 2005/0104146 A1 | 5/2005 | Nickel |
| 2005/0150535 A1 | 7/2005 | Samavedam |
| 2005/0150537 A1 | 7/2005 | Ghoshal |
| 2005/0157544 A1* | 7/2005 | Min et al. ..................... 365/171 |
| 2006/0215444 A1 | 9/2006 | Perner |
| 2007/0034919 A1 | 2/2007 | Wang |
| 2007/0085068 A1 | 4/2007 | Apalkov |
| 2007/0258281 A1 | 11/2007 | Ifo |
| 2008/0019040 A1 | 1/2008 | Zhu |
| 2008/0037179 A1 | 2/2008 | Ito et al. |
| 2008/0055792 A1 | 3/2008 | Zheng |
| 2008/0112094 A1 | 5/2008 | Kent |
| 2008/0137224 A1 | 6/2008 | Gao |
| 2008/0154519 A1 | 6/2008 | Zhou |
| 2008/0180827 A1 | 7/2008 | Zhu |
| 2008/0186758 A1 | 8/2008 | Shen |
| 2008/0225584 A1 | 9/2008 | Gao |
| 2008/0273380 A1 | 11/2008 | Diao |
| 2008/0291720 A1 | 11/2008 | Wang |
| 2008/0291721 A1 | 11/2008 | Apalkov |
| 2008/0310213 A1 | 12/2008 | Chen |
| 2008/0310219 A1 | 12/2008 | Chen |
| 2009/0010040 A1 | 1/2009 | Takase |
| 2009/0040855 A1 | 2/2009 | Luo |
| 2009/0050991 A1 | 2/2009 | Nagai |
| 2009/0073750 A1 | 3/2009 | Leuschner |
| 2009/0185410 A1 | 7/2009 | Huai |
| 2009/0302403 A1 | 12/2009 | Nguyen |
| 2010/0032738 A1 | 2/2010 | Zhu |
| 2010/0034008 A1 | 2/2010 | Wang |
| 2010/0128510 A1 | 5/2010 | Cowburn |

OTHER PUBLICATIONS

Florez, S.H. et al., Modification of Critical Spin Torque Current Induced by rf Excitation, Journal of Applied Physics, 103, 07a708 (2008).

Johnson, M.T., et al., Magnetic anisotropy in metallic multilayers, Rep. Prog. Phys., 1996, pp. 1409-1458, vol. 59, IOP Publishing Ltd., UK.

Kawahara et al., 2Mb Spin-Transfer Torque RAM (SPRAM) with Bit-by-bit Bidirectional Current Write and Parallelizing Direction Current Read, ISSC 2007/Session 26/Non-Volatile Memories/26.5.

Kim, Chris H., et al. Dynamic Vt SRAM: A Leakage Tolerant Cache Memory for Low Voltage Microprocessors, ISLPED '02, Aug. 2002, pp. 251-254, US.

Meng et al., Spin Transfer in Nanomagnetic Devices with Perpendicular Anistropy, Applied Physics Letters 88, 172506 (2006).

Ozatay et al., "Sidewall oxide effects on spin-torque- and magnetic-field-induced reversal characteristics of thin-film nanomagnets", Nature Materials, vol. 7, pp. 567-573 (Jul. 2008).

Prejbeanu et al., "Thermally Assisted MRAM", J. Phys. Condens. Matter 19 (2007) 165218 (23 pp).

Rivkin, K. et al., Magnetization Reversal in the Anisotropy-Dominated Regine Using Time-Dependent Magnetic Fileds, Applied Physics Letters 89, 252507 (2006).

Seki et al., Spin-Polarized Current-Induced Magnetization Reversal in Perpendicularly Magnetized L1o-FePt Layers, Applied Physics Letters 88, 172504 (2006).

Slonczewski et al., Current-Driven Excitation of Magnetic Multilayers, Journal of Magnetism and Magnetic Materials 159 (1996) L1-L7.

Sun, Spin-Current Interaction with Monodomain Magnetic Body: A Model Study, Physical Review B, vol. 62, No. 1, Jul. 2000.

Thiele et al., FeRh//FePt Exchange Spring Films for Thermally Assisted Magnetic Recording Media, Applied Physics Letters, vol. 82, No. 17, Apr. 2003, p. 2859-2861.

Thiele et al., "Magnetic and Structural Properties of FePt-FeRh Exchange Spring Films for Thermally Assisted Magnetic Recording Media", IEEE Trans. Magnetics, vol. 40, Jul. 2004, p. 2537-2542.

Thiele et al., Spin Dynamics of the Anitferromagnetic-to-Ferromagnetic Phase Transition in FeRh on a Sub-Picosecind Time Scale, Applied Physics Letters, vol. 85, No. 14, Oct. 2004, p. 2857-2859.

Yagami, Kojiro, et al., Inspection of Intrinsic Critical Currents for Spin-Transfer Magnetization Switching, IEEE Transactions on Magnetics, Oct. 2005, pp. 2615-2617, vol. 41, No. 10.

Zhang, L., et al., Heat-assisted magnetic probe recording on a granular CoNi/Pt multilayered film, Journal of Physics D: Applied Physics, 2006, pp. 2485-2487, vol. 39, IOP Publishing Ltd., UK.

U.S. Appl. No. 12/125,975, filed May 23, 2008, Inventors: Xi et al.

U.S. Appl. No. 12/239,887, filed Sep. 29, 2008, Inventors: Zheng et al.

U.S. Appl. No. 12/242,254, filed Sep. 30, 2008, Inventors: Zheng et al.

U.S. Appl. No. 12/396,868, filed Mar. 3, 2009; Inventors: Zheng.

U.S. Appl. No. 12/425,457, filed Apr. 17, 2009, Inventors: Gao et al.

U.S. Appl. No. 12/425,466, filed Apr. 17, 2009, Inventors: Lou et al.

Zheng, et al., Multilevel Magnetic Resistive Random Access Memory Written at Curie Point, Intermag Europe 2002, BB-02.

Zheng, Y. et al., Magnetic Random Access Memory (MRAM), J. Nano. Sci. Nano Tec. 7, 177-137 (2007).

U.S. Appl. No. 12/106,363, filed Apr. 21, 2008, Inventors: Xi et al.

U.S. Appl. No. 12/248,237, filed Oct. 9, 2008, Inventor: Zhu.

U.S. Appl. No. 12/389,422, filed Feb. 20, 2009, Inventors: Ahn et al.

X.F. Han et al., Current-Induced Butterfly Shaped Domains and Magnetization Switching in Magnetic Tunnel Junctions, Science and Technology of Advanced Materials 6 (2005) 784-788.

M. Hosomi et al., A Novel Nonvolatile Memory with Spin Torque Transfer Magnetization Switching: Spin-RAM, 2005 IEEE.

J.C. Slonczewski et al., Conductance and Exchange Coupling of Two Ferromagnets Separated by a Tunneling Barrier, 1989 the American Physical Society, Physical Review B, vol. 39, No. 10, Apr. 1, 1989.

* cited by examiner

ND ANISOTROPY

MEMORY CELL WITH STRESS-INDUCED ANISOTROPY

RELATED APPLICATION

This application claims priority to U.S. provisional patent application No. 61/103,752, filed on Oct. 8, 2008 and titled "STRAM memory with stress-induced anisotropy". The entire disclosure of application No. 61/103,752 is incorporated herein by reference.

BACKGROUND

Fast growth of the pervasive computing and handheld/communication industry has generated exploding demand for high capacity nonvolatile solid-state data storage devices. Current technology like flash memory has several drawbacks such as slow access speed, limited endurance, and the integration difficulty. Flash memory (NAND or NOR) also faces significant scaling problems.

Resistive sense memories are promising candidates for future nonvolatile and universal memory by storing data bits as either a high or low resistance state. One such memory, magnetic random access memory (MRAM), features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of MTJ. As the MTJ size shrinks, the switching magnetic field amplitude increases and the switching variation becomes more severe. Memories that include magnetic tunnel junctions which have their magnetization switchable by spin torque, caused by a current induced magnetic field, are commonly referred to as spin torque random access memory (STRAM).

At least because of their small size, it is desirous to use resistive sense elements in many applications, such as magnetic hard disk drive read heads, magnetic sensors, and non-volatile random access memory. Their small size, however, presents some difficulties. Improvements and developments in resistive sense elements and their manufacture, including enhanced magnetic stability, are always desired.

BRIEF SUMMARY

The present disclosure relates to magnetic memory cells and methods of making those cells. The resulting cells have an intrinsic, stress-induced magnetic anisotropy, a result of the combinations of materials of the bottom electrode and memory element.

In one particular embodiment, this disclosure provides a memory cell that has a bottom electrode and a magnetic memory element proximate the electrode. The memory element has a ferromagnetic free layer having a switchable magnetization orientation, a ferromagnetic reference layer having a pinned magnetization orientation, and a non-magnetic spacer layer therebetween. The magnetic memory element has a stress-induced magnetic anisotropy. The free layer can be circular, essentially circular or nearly circular.

In another particular embodiment, this disclosure provides a magnetic memory cell that has a bottom electrode formed of a material having a high intrinsic stress, the bottom electrode having a length direction and a width direction, with a preferential stress relief exerted in or out along the width of the bottom electrode. The memory cell includes a magnetic memory element on the bottom electrode, the element having a ferromagnetic free layer with a switchable magnetization orientation and a stress-induced anisotropy, a ferromagnetic pinned layer having a pinned magnetization orientation, and a non-magnetic spacer layer therebetween, with the free layer formed of a material with magnetostriction.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

This disclosure is directed to magnetic non-volatile memory (MRAM, including STRAM) having improved thermal stability, reduced write current and improved robustness against defects caused by memory shape deviations caused by process imperfections and variability. This disclosure also provides methods for making magnetic memory cells by inducing magnetization anisotropy via internal stress. The combination of a bottom electrode material with intrinsic properties and memory cell materials, with a proper integration flow, provides a memory cell with substantial stress-induced anisotropy in the switchable free layer of the memory element.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

Figure 1:
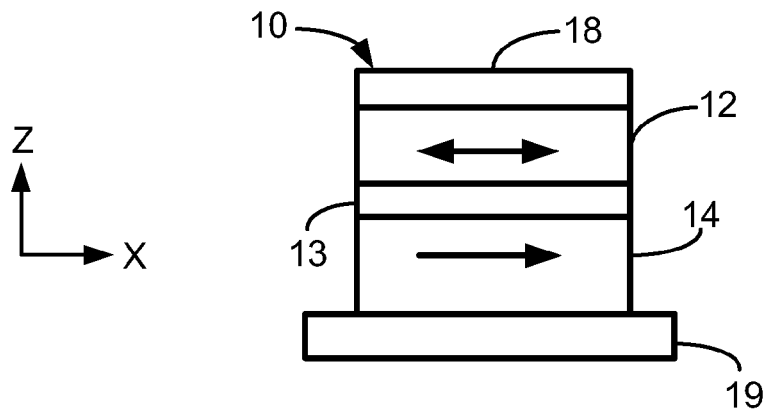
FIG. 1 is a cross-sectional schematic diagram of a magnetic memory cell.

FIG. 1 is a cross-sectional schematic diagram of a magnetic element or cell 10. Cell 10 may be referred to as a magnetic tunnel junction cell (MTJ), variable resistive memory cell or variable resistance memory cell or the like. Magnetic cell 10 includes a ferromagnetic free layer 12 and a ferromagnetic reference (i.e., pinned) layer 14, each having a magnetization orientation. Ferromagnetic free layer 12 and ferromagnetic reference layer 14 are separated by a non-magnetic spacer layer 13. Proximate ferromagnetic reference layer 14 may be an antiferromagnetic (AFM) pinning layer that which pins the magnetization orientation of ferromagnetic reference layer 14 by exchange bias with the antiferromagnetically ordered material of the pinning layer. Examples of suitable pinning materials include PtMn, IrMn, and others. Note that other layers, such as seed or capping layers, are not depicted for clarity. Together, free layer 12, spacer layer 13, reference layer 14 and optional pinning layer form a memory element.

Ferromagnetic layers 12, 14 may be made of any useful ferromagnetic (FM) material such as, for example, Fe, Co or Ni and alloys thereof, such as NiFe and CoFe, and ternary alloys, such as CoFeB. Either or both of free layer 12 and reference layer 14 may be either a single layer or a synthetic antiferromagnetic (SAF) coupled structure, i.e., two ferromagnetic sublayers separated by a metallic spacer, such as Ru or Cr, with the magnetization orientations of the sublayers in opposite directions to provide a net magnetization. Free layer 12 may be a synthetic ferromagnetic coupled structure, i.e., two ferromagnetic sublayers separated by a metallic spacer, such as Ru or Ta, with the magnetization orientations of the sublayers in parallel directions. Either or both layer 12, 14 is often about 0.1-10 nm thick, depending on the material and the desired resistance and switchability of free layer 12.

Non-magnetic spacer layer 13 is an insulating barrier layer sufficiently thin to allow tunneling of charge carriers between reference layer 14 and free layer 12. Examples of suitable electrically insulating material include oxides material (e.g., $Al_2O_3$, $TiO_x$ or MgO). Non-magnetic spacer layer 13 could optionally be patterned with free layer 12 or with reference layer 14, depending on process feasibility and device reliability.

The resistance across magnetic cell 10 is determined by the relative orientation of the magnetization vectors or magnetization orientations of ferromagnetic layers 12, 14. The magnetization direction of ferromagnetic reference layer 14 is pinned in a predetermined direction while the magnetization direction of ferromagnetic free layer 12 is free to rotate, for example, under the influence of spin torque, caused by a current induced magnetic field.

To provide current to cell 10, a first, top electrode 18 is in electrical contact with ferromagnetic free layer 12 and a second, bottom electrode 19 is in electrical contact with ferromagnetic reference layer 14. In this illustrated embodiment, bottom electrode 19 is proximate the substrate (e.g., silicon wafer) on which memory cell 10 is formed. Examples of suitable materials for electrodes 18, 19 include Ti, Ta and W, and alloys thereof, such as TiN and TaN. Electrodes 18, 19 electrically connect ferromagnetic layers 12, 14 to a control circuit providing read and write currents through layers 12, 14. In some embodiments, bottom electrode 19 has a shaped chosen to help achieve stress-induced anisotropy in free layer 12.

In FIG. 1, the magnetization orientation of free layer 12 is illustrated as undefined. In some embodiments, the magnetization orientation of free layer 12 will generally be either parallel to the magnetization orientation of reference layer 14 (i.e., the low resistance state) or anti-parallel to the magnetization orientation of reference layer 14 (i.e., the high resistance state). In some embodiments, the low resistance state may be the "0" data state and the high resistance state the "1" data state, whereas in other embodiments, the low resistance state may be "1" and the high resistance state "0".

Switching the resistance state and hence the data state of magnetic cell 10 via spin-transfer occurs when a current, under the influence of a pinned layer of magnetic cell 10, becomes spin polarized and imparts a spin torque on free layer 12. When a sufficient level of polarized current and therefore spin torque is applied to free layer 12, the magnetization orientation of free layer 12 can be changed among different directions and accordingly, the magnetic cell can be switched between the parallel state, the anti-parallel state, and other states.

Figure 2:
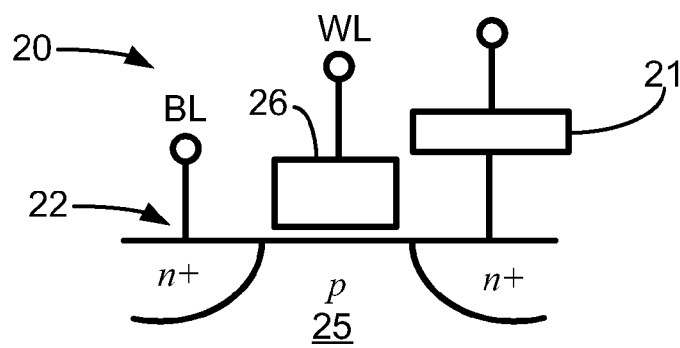
FIG. 2 is a schematic diagram of an illustrative memory unit including a memory cell and a semiconductor transistor.

FIG. 2 is a schematic diagram of an illustrative memory unit 20 including a memory element 21 electrically coupled to a semiconductor transistor 22 via an electrically conducting element. Memory element 21 may be any of the memory cells described herein, or may be any other magnetic memory cell. Transistor 22 includes a semiconductor substrate 25 having doped regions (e.g., illustrated as n-doped regions) and a channel region (e.g., illustrated as a p-doped channel region) between the doped regions. Transistor 22 includes a gate 26 that is electrically coupled to a word line WL to allow selection and current to flow from a bit line BL to memory element 21. An array of programmable metallization memory units 20 can be formed on a semiconductor substrate utilizing semiconductor fabrication techniques. A memory array includes a plurality of word lines WL and a plurality of bit lines BL forming a cross-point array, with a memory element therebetween.

The structures of this disclosure, including any or all of layers 12, 13, 14, may be made by thin film techniques such as chemical vapor deposition (CVD), physical vapor deposition (PVD), and atomic layer deposition (ALD). Material may be removed by etching, such as plasma etching or milling.

The memory cells of this disclosure have magnetic stability that is enhanced, and in some embodiments defined, by stress-induced anisotropy. The stress-induced anisotropy is achieved during the manufacture of the memory cell, by choosing an appropriate shape (e.g., aspect ratio) for the bottom electrode (e.g., bottom electrode 19 of memory cell 10 of FIG. 1) as well as selecting bottom electrode materials and memory element material (e.g., for layers 12, 13, 14) based on desired properties. In addition to the enhanced magnetic stability, the resulting memory cell has reduced cell dimensions, and requires less switching current or write current when incorporated into a memory device.

It has been found that various materials, suitable for use as a bottom electrode, have either a high intrinsic compressive stress (e.g., materials including TiN, Ta, TaN) or a high intrinsic tensile stress (e.g., materials including W). Materials having either a high intrinsic compressive stress or a high intrinsic tensile stress of about 3-6 GPa, and greater, are particularly suited for bottom electrodes according to this disclosure. When combined with memory element materials having large positive magnetostriction or large negative magnetostriction, by certain process steps, memory cells having a stress-induced anisotropy are formed. For example, a bottom electrode material with high intrinsic compressive stress, after patterning, creates a preferential compressive stress relief (also referred to as a tensile stress) in the adjacent memory element, and a bottom electrode material with high intrinsic tensile stress, after patterning, creates a preferential tensile stress relief (also referred to as a compressive stress) in the adjacent memory element.

When combined, bottom electrode materials with high intrinsic compressive stress and ferromagnetic materials with large positive magnetostriction form memory cells having stress-induced anisotropy perpendicular to the length of the bottom electrode. Similarly, bottom electrode materials with high intrinsic tensile stress and ferromagnetic materials with large negative magnetostriction form memory cells having stress-induced anisotropy perpendicular to the length of the bottom electrode. These two combinations of materials are particularly suited for circular or nearly circular or essentially circular magnetic elements. In other embodiments, when combined, bottom electrode materials with high intrinsic tensile stress and ferromagnetic materials with large positive magnetostriction form memory cells having stress-induced anisotropy parallel to the length of the bottom electrode. Similarly, bottom electrode materials with high intrinsic compressive stress and ferromagnetic materials with large negative magnetostriction form memory cells having stress-induced anisotropy parallel to the length of the bottom electrode.

Magnetostriction is a property of ferromagnetic materials. When placed in a magnetic field, these materials change size and/or shape. When ferromagnetic material is magnetized, magnetic domains in the material orient themselves with their axes approximately parallel to one another. Interaction of an external magnetic field with the domains causes the magnetostrictive effect. A material having positive magnetostriction enlarges when placed in a magnetic field, whereas a material having negative magnetostriction shrinks. Examples of materials having positive magnetostriction include CoFe and CoFeB. Examples of materials having negative magnetostriction include NiFe and NiCoFe.

It has been found, using "final element method" (FEM) modeling, that when a material with high compressive intrinsic stress is used as a bottom electrode material on a substrate and is patterned to a size of 0.1 μm thick (Z-direction), with 0.24 μm wide (Y-direction) and 0.8 μm long (X-direction), the resulting bottom electrode has its internal stress reduced to zero at its sides, both along its length and width. The patterning of the shaped electrode leads to the creation of large tensile stress, or preferential compressive stress relief, at the resulting top surface of the electrode.

Figure 3:
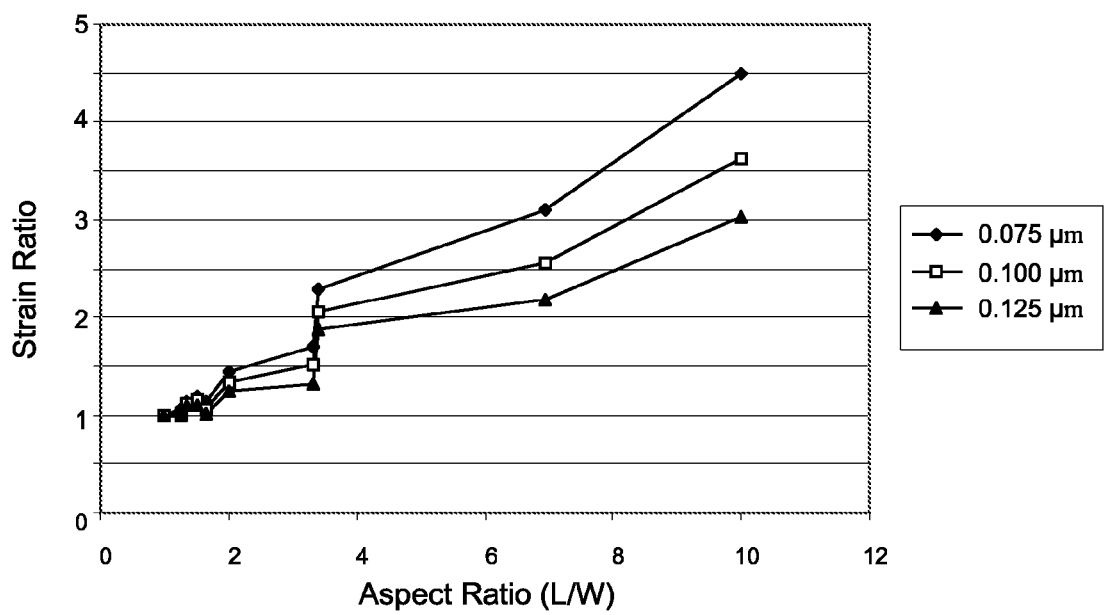
FIG. 3 is a graphical representation of an XY strain ratio in relation to the electrode aspect ratio.
Figure 4:
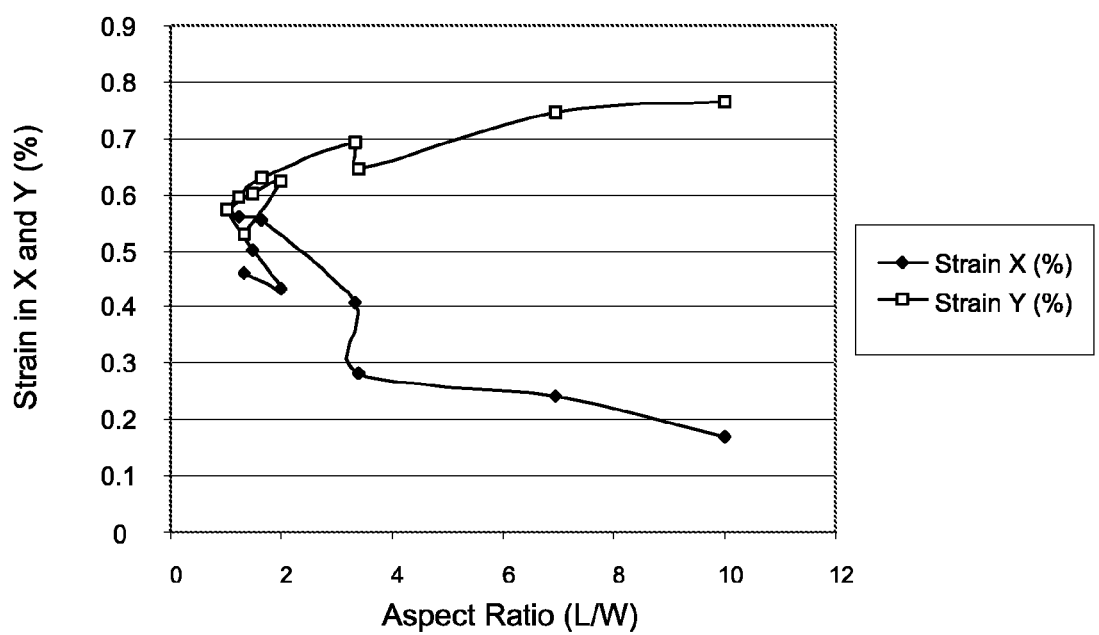
FIG. 4 is a graphical representation of strain in X- and Y-directions in relation to the electrode aspect ratio.

Using the FEM modeling with TiN and assuming intrinsic compressive stress of 3.5 GPa, it was generally found that after patterning, the top face of the bottom electrode expands, leading to preferential compressive stress relief or tensile stress in the adjacent memory layer. Experimentally, it was found that by changing the process conditions, the TiN stress can be adjusted in the range of 0 to 6 GPa. The magnitude of the strain in the X-direction (i.e., electrode length) and Y-direction (i.e., electrode width) as well as the strain ratio depends mainly on the bottom electrode shape (i.e., length and width) and thickness, and can be tailored in quite large ranges. The modeled XY strain ratio in relation to the electrode aspect ratio (for TiN with a constant intrinsic stress of 3.5 GPa) is graphed in FIG. 3 for three different electrode thicknesses, and the modeled strain in X- and Y-directions in relation to the electrode aspect ratio (for TiN with a constant intrinsic stress of 3.5 GPa) is graphed in FIG. 4. The strain ratio, which correlates to the relative expansion difference between the X-direction and Y-direction, depends on the thickness of the electrode and its aspect ratio (e.g., in some embodiments, 4:1 to 10:1). An electrode with a 1:1 aspect ratio (i.e., a square) will have no relative expansion difference. As seen in FIG. 4, it was found that tensile strains of 0.5% and as large as 0.6% and even 0.7% at the top surface are achievable along the shorter direction (i.e., width or Y-direction) of the bottom electrode.

Figure 5A:
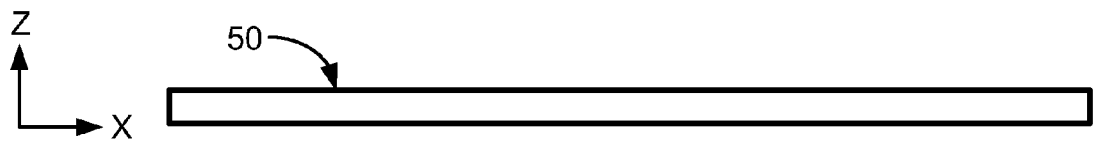
FIGS. 5A-5E illustrate a stepwise method for making a magnetic memory cell.
Figure 5B:
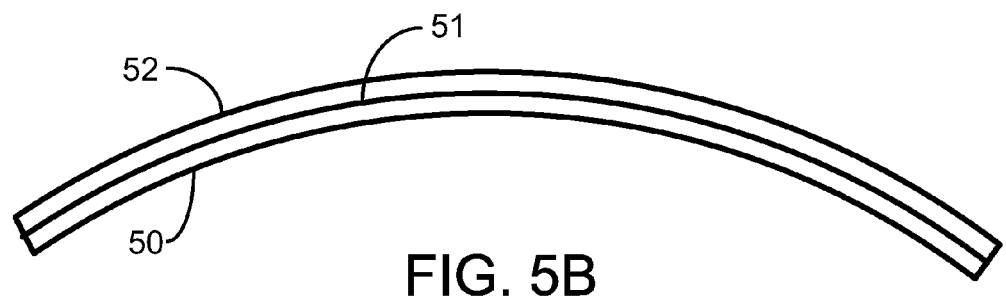

A process to create magnetic anisotropy using the above-described effect of the top surface relaxation is described below in reference to FIGS. 5A-5E. FIGS. 5A-5E illustrate a method of making a magnetic memory cell using a high intrinsic compressive stress bottom electrode material, for example, TiN, and ferromagnetic material having high positive magnetostriction. In FIG. 5A, a substrate 50 (e.g., a Si wafer) is illustrated. At this stage, substrate 50, prior to any processing, is planar or at least essentially planar. In FIG. 5B, a continuous layer (sheet or film) of bottom electrode material 52, having high compressive stress, is applied (e.g., deposited) onto substrate 50. Bottom electrode material 52 may be, for example, about 0.05 - 5 μm thick. In some embodiments, bottom electrode material 52 is about 0.05 to 0.2 μm thick or about 0.1 to 0.2 μm. Bottom electrode material 52, when deposited as a sheet film or layer, has a large intrinsic compressive stress with a desire to shrink, thus bowing, curling or bending substrate 50 outward due to the tight interface 51 between electrode material 52 and substrate 50. The bowing effect of substrate 50 may be more or less pronounced than that depicted in FIG. 5B, although typically will be less bowed than illustrated. In some embodiments, the amount of bowing may not be discernible to the naked eye and even to some inspection equipment.

Onto the bowed electrode material 52 is applied (e.g., deposited) a memory layer 54, forming an interface 53 between electrode material 52 and memory layer 54. Memory layer 54 may be any magnetic memory cell material that has positive magnetostriction. Various examples of memory cell materials have been provided above in respect to memory cell 10 and FIG. 1; alternate memory cell materials could also be used in memory layer 54. Memory layer 54 may have, for example, a ferromagnetic CoFe or CoFeB layer with a switchable magnetization orientation, a ferromagnetic CoFe or CoFeB layer with a pinned magnetization orientation, with a spacer layer therebetween. It is not necessary that all of the layers of memory layer 54 has positive magnetostriction; in some embodiments, only the switchable layer has positive magnetostriction, in other embodiments, only the pinned layer has positive magnetostriction, whereas in other embodiments, both the switchable and pinned layers have positive magnetostriction. Memory layer 54 may be, for example, about 10-50 nm thick. In FIG. 5D, memory layer 54 is patterned resulting in memory layer portions 54' on bottom electrode material 52. From FIG. 5D, bottom electrode material 52 is patterned to form bottom electrode 52' in FIG. 5E. When bottom electrode material 52 is patterned to form bottom electrodes 52', the top surface of material 52 (which is interface 53 of FIG. 5C between electrode material 52 and memory layer 54) expands. This expansion results from decrease in the compressive stress in the resulting bottom electrode 52', the relative change in the compressive stress being larger in the shorter dimension of bottom electrode 52' (e.g., the width) than the longer dimensions of bottom electrode 52'.

Figure 5C:
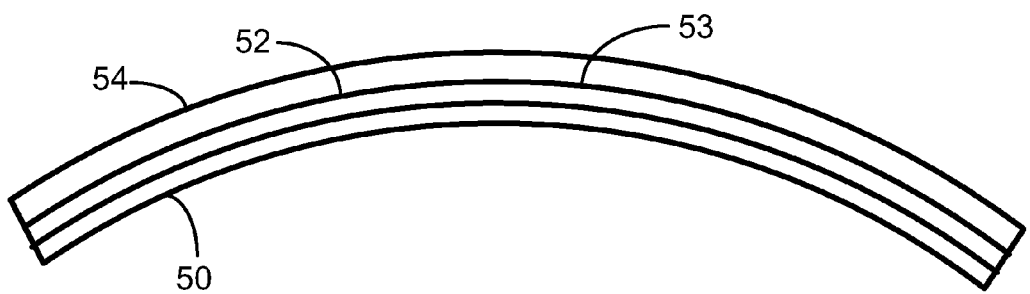
Figure 5D:
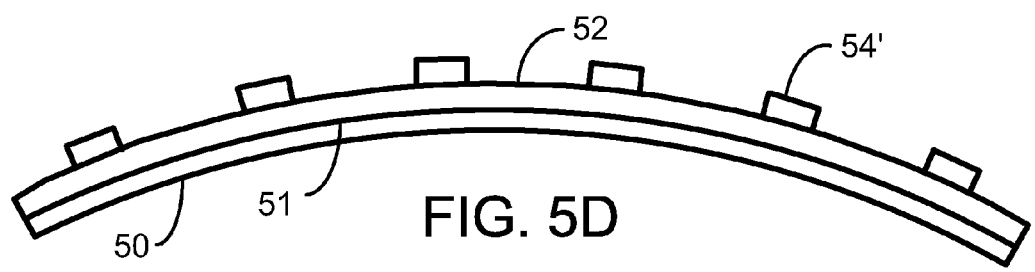

In an alternate process, not illustrated, memory layer 54 and electrode material 52 from FIG. 5C may be first patterned to a stack having a size of the final bottom electrode, and then the resulting memory element is patterned.

The resulting stacks of memory element 54' on bottom electrode 52' have exposed substrate regions 55 between adjacent stacks. Exposed substrate regions 55 allow substrate 50 to straighten. A top electrode (not illustrated) is formed over memory element 54', typically after being backfilled with insulative material, to complete a memory cell.

Figure 6:
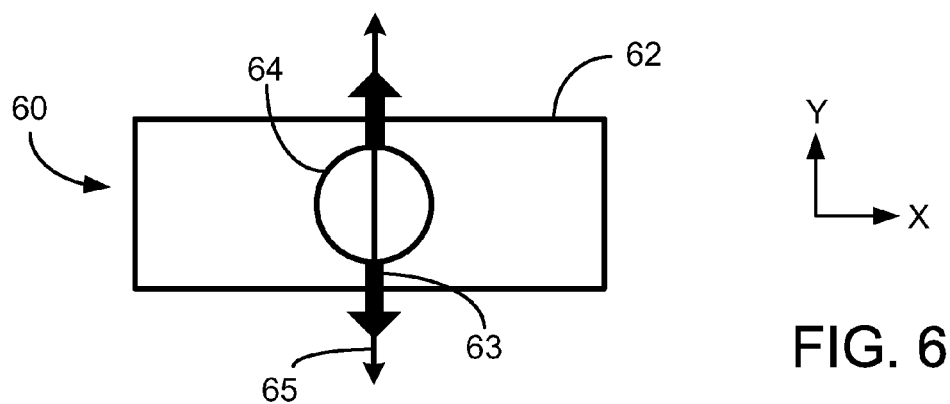
FIG. 6 is a schematic top view of the magnetic memory cell made by the method of FIGS. 5A-5E.

FIG. 6 illustrates a "top down view" of a memory cell 60, the result of the previously described method. This memory cell 60 has a rectangular bottom electrode 62 having a length (in the X-direction) and a width (in the Y-direction), formed from a material having high intrinsic compressive stress (e.g., TiN).

Figure 5E:
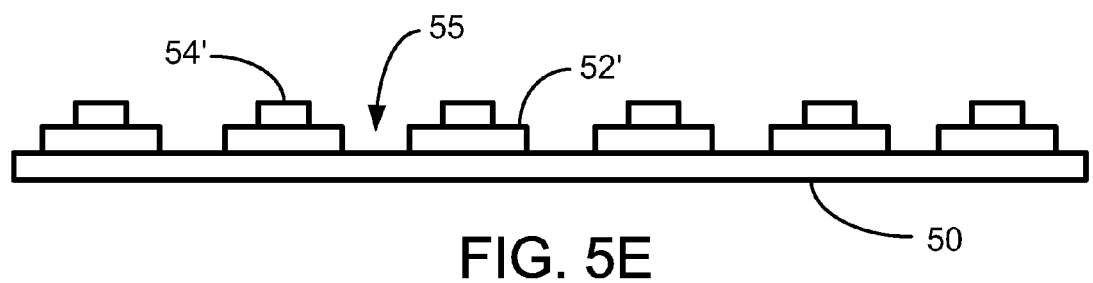

After the patterning process of FIG. 5E, bottom electrode 62 has outward expansion on its top surface in the Y-direction, indicated by arrows 63, due to the compressive stress release at the sides of the material of bottom electrode 62. Expansion may additionally occur in the X-direction as well, however, the relative expansion in the Y-direction is greater (in %) than the expansion in the X-direction (for example, the relative expansion in Y-direction may be 0.8% whereas relative expansion in X-direction may be 0.1%). The relative expansion difference, referred to herein as the preferential stress relief 63, or the like, will depend on the thickness of bottom electrode 62 and its aspect ratio (e.g., in some embodiments, 4:1 to 10:1). A bottom electrode with a 1:1 aspect ratio (i.e., a square), will have no relative expansion difference.

Centrally positioned on bottom electrode 62 is memory element 64. Memory element 64 may have a shape that is ellipsoid, circular, nearly circular or essentially circular, "football" shaped, or the like. In some embodiments, memory element 64 has an aspect ratio of 2 or less. By the terms "essentially circular" or "nearly circular", what is intended is that memory element 64 has a diameter that varies no more than 10% around the shape of the element, in some embodiments no more than 5%. Additionally, an "essentially circular" or "nearly circular" memory element has an aspect ratio of 0.9 to 1.1, in some embodiments 0.95 to 1.05. In the illustrated embodiment, memory element 64 is circular. In some embodiments, only a portion (e.g., one layer) of memory element 64 is circular, nearly circular or essentially circular.

Memory element 64 includes, for example, a ferromagnetic free layer having positive magnetostriction with a switchable magnetization orientation, a ferromagnetic layer having a pinned magnetization orientation, with a non-magnetic spacer layer therebetween. In some embodiments, the pinned ferromagnetic layer also has positive magnetostriction. The magnetization orientation of the free layer may be switchable by spin torque induced by a magnetic field or by current, thus memory element 64 being a spin torque or STRAM element.

Memory element 64 and thus memory cell 60 has a stress-induced magnetic anisotropy 65, which dictates the desired orientation of the magnetization of the ferromagnetic layers. The combination of preferential compressive stress relief 63 from electrode 62 and positive magnetostriction of element 64 creates stress-induced magnetic anisotropy 65 in memory element 64. In this embodiment, magnetic anisotropy 65 is parallel to stress relief 63 from bottom electrode 62, along the Y-direction.

In some embodiments, circular memory element 64 is annealed (either with or without an external magnetic field) to create an exchange pinning field between any pinning layer and the ferromagnetic pinned layer (e.g., reference layer 14 of FIG. 1). Because the magnetization orientation of the pinned layer must be either parallel or anti-parallel to the magnetization orientation of the free or switchable layer (e.g., free layer 12 of FIG. 1), the magnetic anneal is along the same axis as anisotropy 65.

Figure 7A:
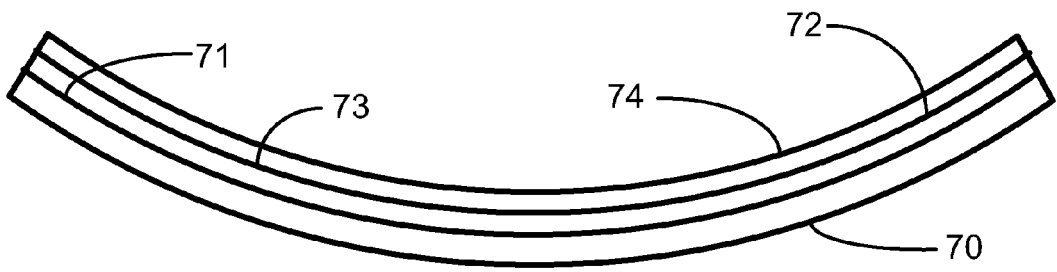
FIGS. 7A and 7B illustrate a summarized second method for making a magnetic memory cell.
Figure 7B:
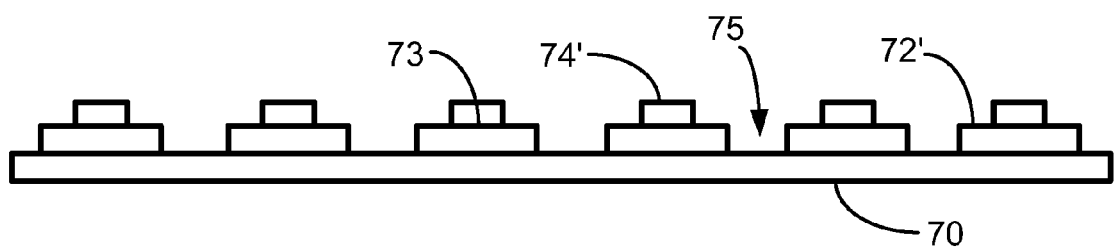

FIGS. 7A and 7B summarize a method of making a magnetic memory cell using a high tensile stress bottom electrode material and ferromagnetic material having high negative magnetostriction. Various features of the process and materials of the method of FIGS. 7A and 7B are the same as or similar to the process and materials of the method of FIGS. 5A-5E, unless indicated otherwise.

In FIG. 7A, a substrate 70 (e.g., a Si wafer) is illustrated having a continuous layer of bottom electrode material 72, having high intrinsic tensile stress, thereon, with a desire to expand, thus bowing, curling or bending substrate 70 inward. Onto the bowed electrode material 72 is a memory layer 74. Memory layer 74 may have, for example, a ferromagnetic NiFe or NiCoFe layer with a switchable magnetization orientation, a ferromagnetic NiFe or NiCoFe layer with a pinned magnetization orientation, with a spacer layer therebetween. At least one of the layers of memory layer 74 has negative magnetostriction. The interface between substrate 70 and electrode material 72 is identified as 71 and the interface between electrode material 72 and memory layer 74 is identified as 73.

Bottom electrode material 72 and memory layer 74 are sequentially patterned in FIG. 7B, resulting in stacks of electrode 72' and memory elements 74' with exposed substrate regions 75 between adjacent stacks. Exposed substrate regions 75 allow substrate 70 to straighten. When bottom electrode material 72 is patterned to form electrodes 72', the top surface of material 72 at interface 73 compresses. This compression creates a compressive stress in memory elements 74'. A top electrode (not illustrated) is formed over memory element 74', typically after being backfilled with insulative material, to complete a memory cell.

Figure 8:
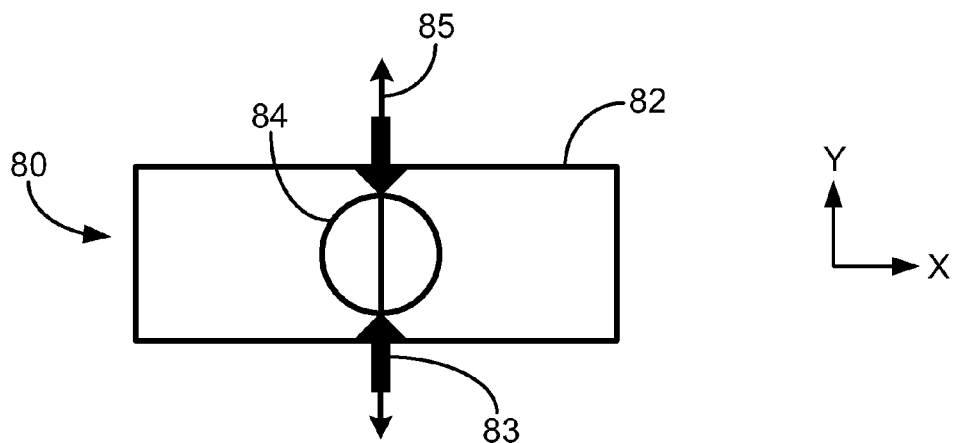
FIG. 8 is a schematic top view of the magnetic memory cell made by the method of FIGS. 7A and 7B.

FIG. 8 illustrates a memory cell 80, the result of the immediately previously described method. This memory cell 80 has a rectangular bottom electrode 82 having a length (in the X-direction) and a width (in the Y-direction), formed from a material having high intrinsic tensile stress. After the patterning process, bottom electrode 82 has inwardly directed preferential tensile stress relief on its top surface in the Y-direction, indicated by arrows 83, due to the stress release at the sides of the material of bottom electrode 82. Contraction may additionally occur in the X-direction as well, however, the relative contraction in the Y-direction is greater (in %) than the contraction in the X-direction (for example, the relative contraction in Y-direction may be 0.8% whereas relative contraction in X-direction may be 0.1%).

Centrally positioned on bottom electrode 82 is memory element 84. In the illustrated embodiment, memory element 84 is circular. Memory element 84 includes, for example, a ferromagnetic free layer having negative magnetostriction with a switchable magnetization orientation, a ferromagnetic layer having a pinned magnetization orientation, with a non-magnetic spacer layer therebetween. In some embodiments, the pinned layer also has negative magnetostriction. The magnetization orientation of the free layer may be switchable by spin torque induced by a magnetic field or by current, thus memory element 84 being a spin torque memory element or STRAM element.

Memory element 84 and thus memory cell 80 has a stress-induced magnetic anisotropy 85, which dictates the desired orientation of the magnetization of the ferromagnetic layers. The combination of preferential tensile stress relief 83 from electrode 82 and negative magnetostriction of element 84 creates stress-induced magnetic anisotropy 85 in memory element 84. In this embodiment, anisotropy 85 is parallel to tensile stress relief 83 from bottom electrode 82, along the Y-direction. In some embodiments, anisotropy 85 may be referred to as being anti-parallel to tensile stress relief 83.

In some embodiments, circular memory element 84 is annealed (either with or without an external magnetic field) to create an exchange pinning field between any pinning layer and the ferromagnetic pinned layer (e.g., reference layer 14 of FIG. 1). Because the magnetization orientation of the pinned layer must be either parallel or anti-parallel to the magnetization orientation of the free or switchable layer (e.g., free layer 12 of FIG. 1), the magnetic anneal is along the same axis as anisotropy 85.

Figure 9:
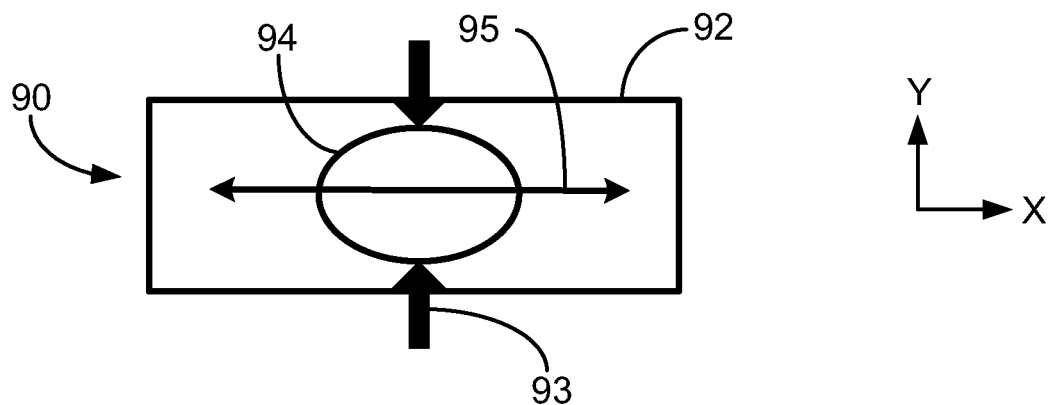
FIG. 9 is a schematic top view of another embodiment of a magnetic memory cell.
Figure 10:
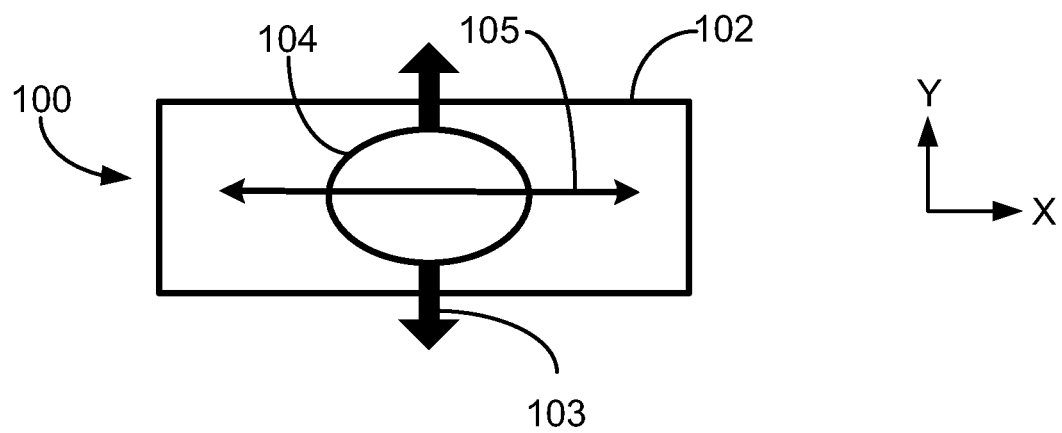
FIG. 10 is a schematic top view of yet another embodiment of a magnetic memory cell.

FIGS. 9 and 10 illustrate two alternative memory cells. Various features of these memory cells are the same as or similar to the features of memory cell 60 of FIG. 6 and memory cell 80 of FIG. 8, unless indicated otherwise. The memory cell of FIG. 9 has a high tensile stress bottom electrode material and ferromagnetic material having high positive magnetostriction, and the memory cell of FIG. 10 has a high compressive stress bottom electrode material and ferromagnetic material having high negative magnetostriction.

Memory cell 90 of FIG. 9 has a rectangular bottom electrode 92 having a length (in the X-direction) and a width (in the Y-direction), formed from a material having high intrinsic tensile stress. After the patterning process, bottom electrode 92 has inwardly directed preferential tensile stress relief, or compressive stress, indicated by arrows 93. Centrally positioned on bottom electrode 92 is an elliptical memory element 94. Memory element 94 includes, for example, a ferromagnetic free layer with a switchable magnetization orientation, a ferromagnetic layer having a pinned magnetization orientation, with a non-magnetic spacer layer therebetween. At least one of the ferromagnetic layers has positive magnetostriction.

Memory element 94 and thus memory cell 90 has a stress-induced magnetic anisotropy 95, which dictates the desired orientation of the magnetization of the ferromagnetic layers. The combination of tensile stress relief 93 from electrode 92 and positive magnetostriction of element 94 creates stress-induced magnetic anisotropy 95 perpendicular to tensile stress relief 93 from bottom electrode 92, in this embodiment, along the X-direction.

Memory cell 100 of FIG. 10 has a rectangular bottom electrode 102 having a length (in the X-direction) and a width (in the Y-direction), formed from a material having high intrinsic compressive stress. After the patterning process, bottom electrode 102 has outwardly directed preferential compressive stress relief, or tensile stress, indicated by arrows 103. Centrally positioned on bottom electrode 102 is an elliptical memory element 104. Memory element 104 includes, for example, a ferromagnetic free layer with a switchable magnetization orientation, a ferromagnetic layer having a pinned magnetization orientation, with a non-magnetic spacer layer therebetween. At least one of the ferromagnetic layers has negative magnetostriction.

Memory element 104 and thus memory cell 100 has a stress-induced magnetic anisotropy 105, which dictates the desired orientation of the magnetization of the ferromagnetic layers. The combination of compressive stress relief 103 from electrode 102 and negative magnetostriction of element 104 creates stress-induced magnetic anisotropy 105 perpendicular to compressive stress relief 103 from bottom electrode 102, in this embodiment, along the X-direction.

In some embodiments, ellipsoid memory element 94, 104 is annealed (either with or without an external magnetic field) to create an exchange pinning field between any pinning layer and the ferromagnetic pinned layer (e.g., reference layer 14 of FIG. 1), and to set the long axis (in this embodiment, in the X-direction) of ellipsoid memory element 94, 104.

Memory elements 64, 84, 94, 104, with stress-induced anisotropy 65, 85, 95, 105 are less affected by shape variations than memory elements having anisotropy formed by other methods. Roughness, imperfections or imprecision at the edges of memory element 64, 84, 94, 104 should not affect the anisotropy and thus magnetization orientation. Less required precision allows for an easier manufacturing (e.g., photolithography) process.

In some embodiments, circular memory elements 64, 84, or other memory elements having an aspect ratio of 2 or less, with anisotropy 65, 85, provide numerous benefits over ellipsoid memory elements (e.g., elements 94, 104). For example, a circular memory element occupies less area than an ellipsoid memory element, thus allowing higher element density. Additionally, a circular memory element, having less area, requires less switching current than an ellipsoid memory element. Memory elements 64, 84, 94, 104 having an aspect ratio of 2 or less, are also easier to manufacture (e.g., via photolithograph) because the smallest critical dimension is no different than that of an ellipsoid memory element having an aspect ratio greater than 2.

Memory cells having memory layers with positive magnetostriction with tensile stress or preferential compressive stress relief exerted thereon (from a bottom electrode having intrinsic compressive stress) (e.g., memory cell 60) and memory cells having memory layers with negative magnetostriction with compressive stress or preferential tensile stress relief exerted thereon (from a bottom electrode having intrinsic tensile stress) (e.g., memory cell 80), are particularly suited to have a memory element shape that is circular, nearly circular or essentially circular, because the stress-induced anisotropy is in the shorter direction of the bottom electrode. With such as construction, it is desired that the long axis of an ellipsoid or other elongate memory element is along the shorter direction or Y-direction of the bottom electrode. Ellipsoid or other elongate memory element are better suited for memory cells having memory layers with negative magnetostriction with tensile stress or preferential compressive stress relief exerted thereon (from a bottom electrode having intrinsic compressive stress) (e.g., memory cell 100) and for memory cells having memory layers with positive magnetostriction with compressive stress or preferential tensile stress relief exerted thereon (from a bottom electrode having intrinsic tensile stress) (e.g., memory cell 90), because the stress-induced anisotropy is in the longer direction of the bottom electrode. Thus, the long axis of an ellipsoid or elongate memory element can be parallel to the long axis or the X-direction. Circular, nearly circular or essentially circular memory elements are also suited for these cells having stress-induced anisotropy along the longer direction of the bottom electrode.

By appropriately choosing the composition of the memory layer, (e.g., of the switching free layer), magnetostrictions on the order of $10^{-5}$ are achievable. This magnetostriction, in combination with the strain from the bottom electrode, leads to stress-induced anisotropy for the switching free layer; this anisotropy may be, for example, on the order of 100 Oe.

As described above, bottom electrode materials having either a high intrinsic compressive stress or a high intrinsic tensile stress can be combined with memory element materials having large positive magnetostriction or large negative magnetostriction, by certain process steps, to form memory cells having a stress-induced anisotropy. In some embodiments, a method for making a memory cell includes forming a bottom electrode layer from either a material having a high intrinsic tensile stress or a material having a high intrinsic compressive stress, and forming a memory layer on the bottom electrode layer, the memory layer comprising either a positive magnetostrictive material or a negative magnetostrictive material.

The method includes patterning the bottom electrode layer and the memory layer to form at least one bottom electrode and at least one memory element having a stress-induced magnetic anisotropy. When the bottom electrode material has a high intrinsic compressive stress and the free layer comprises a material having positive magnetostriction, a preferential compressive stress relief is exerted outward on the memory element in the width direction and the free layer has a stress-induced anisotropy parallel to the tensile stress. When the bottom electrode material has a high intrinsic tensile stress and the free layer comprises a material having negative magnetostriction, a preferential tensile stress relief is exerted inward on the memory element in the width direction and the free layer has a stress-induced anisotropy parallel to the compressive stress. When the bottom electrode material has a high intrinsic tensile stress and the free layer comprises a material having positive magnetostriction, a preferential tensile stress relief is exerted inward on the memory element in the width direction and the free layer has a stress-induced anisotropy perpendicular to the compressive stress. When the bottom electrode material has a high intrinsic compressive stress and the free layer comprises a material having negative magnetostriction, a preferential compressive stress relief is exerted outward on the memory element in the length direction and the free layer has a stress-induced anisotropy perpendicular to the tensile stress.

For embodiments where the bottom electrode material has a high intrinsic tensile stress, the substrate and the bottom electrode layer bow outward, but when patterned, the substrate returns to a generally planar state. Conversely, when the bottom electrode material has a high intrinsic compressive stress, the substrate and the bottom electrode layer bow inward, but when patterned, the substrate returns to a generally planar state.

The overall process for patterning the memory elements is independent of the materials used. Rather, the orientation of any magnetic anneal to set the direction of the ferromagnetic pinned layer is varied. For positive magnetostriction with compressive stress relief and negative magnetostriction with tensile stress relief, the anneal process is in the Y-direction or shorter dimension of the bottom electrode. For positive magnetostriction with tensile stress relief and negative magnetostriction with compressive stress relief, the anneal process is rotated 90 degrees to be parallel to the long dimension or X-direction.

Figure 11:
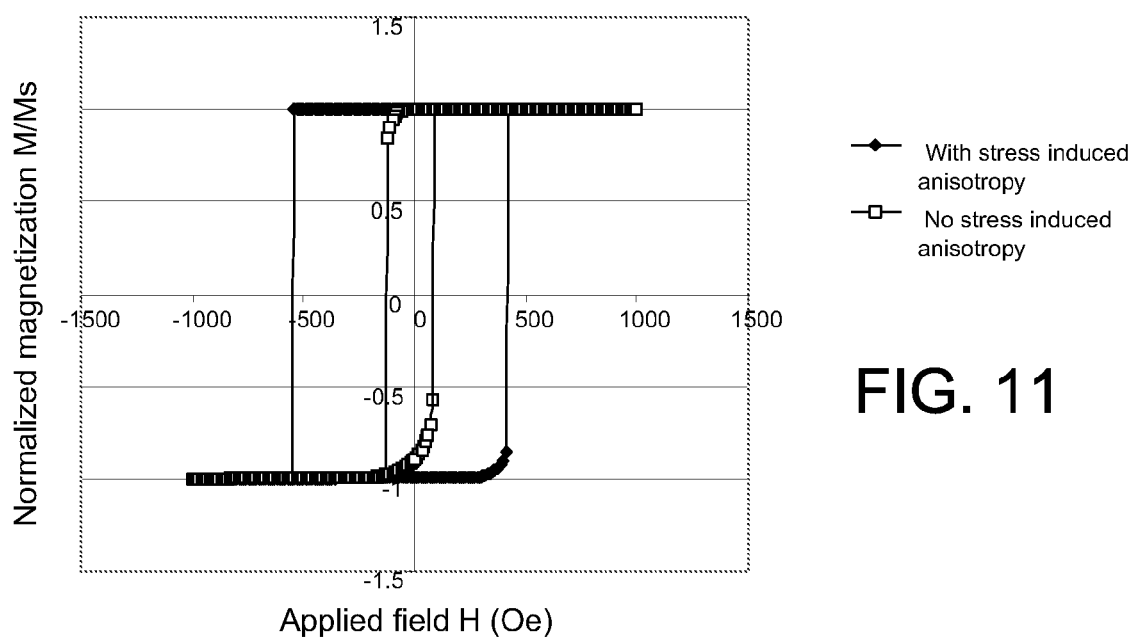
FIG. 11 is a graphical representation of a hysteresis loop.

FIG. 11 shows micromagnetic modeling results of the hysteresis loops of two 70 nm by 80 nm magnetic memory cells, with and withhout stress-induced anisotropy. The graph illustrates the effect of stress-induced anisotropy on the hysteresis loop. For the modeling, the memory layer had $2\times10^{-5}$ magnetostriction. The corresponding bottom electrode was 0.1 µm thick with an aspect ration of 4 and 3.5 GPa intrinsic stress. The micromagnetic modeling results, as illustrated in FIG. 11, confirm the significant low switching current enhancement, which translates directly to a large thermal stability enhancement.

Thus, embodiments of the MEMORY CELL WITH STRESS-INDUCED ANISOTROPY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic memory cell comprising:
    a bottom electrode comprising a material having a high intrinsic stress, the bottom electrode having a length direction and a width direction, with a preferential stress relief exerted in or out along the width direction of the bottom electrode; and
    a magnetic memory element comprising a ferromagnetic free layer having a switchable magnetization orientation and a stress-induced anisotropy, a ferromagnetic pinned layer having a pinned magnetization orientation, and a non-magnetic spacer layer therebetween, the free layer comprising a material with magnetostriction, and wherein the magnetic memory element is circular.

2. The memory cell of claim 1 wherein the bottom electrode material has a high intrinsic compressive stress and an outward directed preferential stress relief.

3. The memory cell of claim 2 wherein the free layer magnetostriction is positive magnetostriction and the stress-induced anisotropy is parallel to the preferential stress relief.

4. The memory cell of claim 2 wherein the free layer magnetostriction is negative magnetostriction and the stress-induced anisotropy is perpendicular to the preferential stress relief.

5. The memory cell of claim 1 wherein the bottom electrode material has a high intrinsic tensile stress and an inward directed preferential stress relief.

6. The memory cell of claim 5 wherein the free layer magnetostriction is positive magnetostriction and the stress-induced anisotropy is perpendicular to the preferential stress relief.

7. The memory cell of claim 5 wherein the free layer magnetostriction is negative magnetostriction and the stress-induced anisotropy is anti-parallel to the preferential stress relief.

8. The memory cell of claim 1 wherein the magnetic memory element has a magnetostriction of about $10^{-5}$ and the stress-induced anisotropy is about 100 Oe.

9. The memory cell of claim 1 wherein the magnetic memory element is annealed to create an exchange pinning field.

* * * * *